United States Patent
Knoedgen

(10) Patent No.: US 8,872,576 B2
(45) Date of Patent: Oct. 28, 2014

(54) RECHARGING OF THE GATE CHARGE OF A TRANSISTOR

(71) Applicant: Dialog Semiconductor GmbH, Kirchheim/Teck-Nabern (DE)

(72) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 14/018,577

(22) Filed: Sep. 5, 2013

(65) Prior Publication Data
US 2014/0201543 A1    Jul. 17, 2014

(30) Foreign Application Priority Data

Jan. 17, 2013 (EP) .................................... 13151741

(51) Int. Cl.
*H03K 17/687* (2006.01)
*G06F 1/26* (2006.01)
*H03K 17/691* (2006.01)

(52) U.S. Cl.
CPC ................ *H03K 17/691* (2013.01); *G06F 1/26* (2013.01)
USPC ............................ 327/427; 327/434; 327/437

(58) Field of Classification Search
USPC .................................................. 327/365–508
See application file for complete search history.

(56) References Cited

U.S. PATENT DOCUMENTS

| | | | | |
|---|---|---|---|---|
| 5,010,261 A | * | 4/1991 | Steigerwald | 327/404 |
| 5,134,320 A | * | 7/1992 | Perusse | 327/382 |
| 2010/0067275 A1 | * | 3/2010 | Wang et al. | 363/127 |

FOREIGN PATENT DOCUMENTS

WO    WO 2011 119102    9/2011

OTHER PUBLICATIONS

European Search Report 13151741.9-1805 Mailed: Jul. 3, 2013, Dialog Semiconductor GmbH.

\* cited by examiner

*Primary Examiner* — Brandon S Cole
(74) *Attorney, Agent, or Firm* — Saile Ackerman LLC; Stephen B. Ackerman

(57) ABSTRACT

Power switches operate with reduced power consumption. A circuit controls a power switch via its gate having a gate capacitor. The circuit comprises an on-control switch coupling the gate of the power switch with a charge supply to provide a gate charge to the gate capacitor of the power switch, thereby putting the power switch to the on-state; a transformer and an off-control switch coupling the gate of the power switch with ground via a primary winding of the transformer to discharge the gate capacitor of the power switch, thereby causing a discharge current through the primary winding and thereby putting the power switch to the off-state; wherein a secondary winding is coupled to the charge supply, such that a current, which is induced in the secondary winding, recharges the charge supply.

23 Claims, 5 Drawing Sheets

RECHARGING OF THE GATE CHARGE OF A TRANSISTOR

TECHNICAL FIELD

The present document relates to power switches. In particular, the present document relates to a circuit arrangement and a method for operating power switches with reduced power consumption.

BACKGROUND

Power switches are used e.g. in DC-DC power converters to toggle the power converters between different modes or states. Applications for such power converters are e.g. LED based light bulbs or portable application (for charging the battery of a portable electronic device). In this context a power switch, e.g. a transistor such as a metal oxide semiconductor (MOS) field effect transistor (FET), is switched between an on-state and an off-state at a pre-determined commutation cycle rate. The commutation cycle rate is typically in the range of 10 KHz to several MHz, but it is desirable to further increase the commutation cycle rate in order to allow for a further integration of the DC-DC power converters. In particular, when increasing the commutation cycle rate or the clock rate, the size of external components of the DC-DC power converters, such as coils, transformers and/or capacitors may be reduced, thereby allowing for a reduction of the size of the DC-DC power converter. By way of example, for power converters in portable applications (comprising e.g. rechargeable battery systems) the clock rate may be in the range of 1 MHz or higher.

In order to put a power switch, e.g. a MOSFET, into the on-state, a gate voltage may be applied to a gate of the power switch, thereby charging a gate capacitance of the power switch. On the other hand, in order to put the power switch into the off-state, the gate of the power switch may be coupled to ground, thereby discharging the gate capacitance of the power switch. As such, the gate capacitance of the power switch is charged and discharged at the commutation cycle rate. The gate charge (i.e. the charge of the gate capacitance) adds to the losses of the power converter comprising the power switch. These losses increase with increasing commutation cycle rate. Hence, the losses due to the gate charge are expected to become a serious issue, when operating DC-DC power converters with increased commutation cycle rates.

The present document addresses the above mentioned technical problem. In particular, the present document describes a circuit arrangement and a method for commutating a power switch with reduced losses.

SUMMARY

A principal object of the present disclosure is to achieve a circuit arrangement and a method for operating power switches with reduced power consumption.

A further object of the present disclosure is to recover a gate charge of a power switch, thereby allowing the power switch to be commutated between the on-state and the off-state in a power efficient manner.

A further object of the present disclosure is to distribute a recovered gate charge from the first power switch to a plurality of different charge supplies.

Furthermore an object of the present disclosure is to recover the gate charge of the plurality of parallel first power switches.

Moreover an object of the present disclosure is to arrange first and second power switches in series, with the second power switch being coupled to a high side voltage and the first power switch being coupled to a low side voltage, wherein the first and second power switches may be put in respective on/off-states in an alternating manner and to bounce the gate charge bounces between the first and second power switches, thereby allowing for a commutation of the first and second power switches in an energy efficient manner.

In accordance with the objects of this disclosure a method for controlling a first power switch via a gate of the first power switch, wherein the gate of the first power switch comprises a gate capacitor has been achieved. The method comprising the steps of: providing a circuit comprising the first power switch, a transformer, and a charge supply, coupling the gate of the first power switch with a charge supply to provide a gate charge to the gate capacitor of the first power switch, thereby putting the first power switch to the on-state, and coupling the gate of the first power switch with ground via a primary winding of a transformer to discharge the gate capacitor of the first power switch, thereby causing a discharge current through the primary winding and thereby putting the first power switch to the off-state.

According to an aspect, a circuit configured to control a first power switch via a gate of the first power switch is described. The circuit may be referred to as a control circuit. The circuit may be implemented as an integrated circuit. The first power switch may be part of a power converter (e.g. a switched-mode power converter such as a SEPIC, a buck converter, a boost converter, a flyback converter, and/or a buck-boost converter) and/or part of a half bridge and/or a full bridge. In particular, the first power switch may be or may comprise a transistor, such as a metal oxide semiconductor field effect transistor. The gate of the first power switch may comprise a gate capacitor. By charging the gate capacitor of the first power switch, the first power switch may be put into an on-state (i.e. the first power switch may be closed). On the other hand, by discharging the gate capacitor of the first power switch, the first power switch may be put into an off-state (i.e. the first power switch may be opened).

The circuit may comprise a first on-control switch configured to couple the gate of the first power switch with a charge supply to provide a gate charge to the gate capacitor of the first power switch, thereby putting the first power switch to the on-state. The first on-control switch may be implemented as or may comprise a transistor. The first on-control switch may be controllable to be opened and/or closed. Alternatively or in addition, the first on-control switch may be or may comprise a diode, which may be configured to let pass a current towards the gate of the first power switch, and which may be configured to block a current away from the gate of the first power switch. As such, the gate of the first power switch may be coupled to the charge supply (when the first on-control switch is closed) and decoupled from the charge supply (when the first on-control switch is open).

Furthermore, the circuit may comprise a transformer comprising a primary winding and a secondary winding which are electromagnetically coupled. In particular, the transformer may be configured to induce a current in the secondary winding, subject to a current in the primary winding and vice versa.

In addition, the circuit may comprise a first off-control switch configured to couple the gate of the first power switch with ground via the primary winding of the transformer to discharge the gate capacitor of the first power switch, thereby causing a discharge current through the primary winding and thereby putting the first power switch to the off-state. The first off-control switch may comprise one or more transistors which may be opened and closed. In particular, the first off-control switch may be configured to decouple the gate of the first power switch from ground, when the first off-control switch is open, and to couple the gate of the first power switch to ground, when the first off-control switch is closed.

The secondary winding of the transformer may be coupled to the charge supply, such that a current, which is induced in the secondary winding by the discharge current in the primary winding, recharges the charge supply. By way of example, the charge supply may comprise a capacitor or a battery which may be configured to supply a gate charge and to recover the gate charge. In particular, the charge supply may comprise a gate capacitor of another power switch (e.g. a second power switch referred to below). As such, the gate charge of the power switches may be bounced between different gate capacitors.

Overall, the control circuit may be configured to recover the gate charge of the first power switch, thereby allowing the first power switch to be commutated between the on-state and the off-state in a power efficient manner. This allows the implementation of energy efficient power converters comprising the first power switch.

It should be noted that the transformer may comprise a plurality of secondary windings which are electromagnetically coupled to the primary winding. The plurality of secondary windings may be used to distribute the recovered gate charge from the first power switch to a plurality of different charge supplies. The plurality of secondary windings may be coupled to a respective plurality of charge supplies, such that currents, which are induced in the plurality of secondary windings by the discharge current in the primary winding, charge the plurality of charge supplies, respectively.

Furthermore, it should be noted that the circuit may comprise a plurality of first power switches in parallel, and that the circuit may be configured to recover the gate charge of the plurality of parallel first power switches.

The secondary winding of the transformer may be coupled at one end of the secondary winding to ground and at another end of the secondary winding to the charge supply. Furthermore, the circuit may comprise a decoupling switch which is configured to decouple the charge supply from ground to prevent a discharging of the charge supply to ground. The decoupling switch may comprise a diode which is configured to block a current from the charge supply to ground. As such, it is ensured that the charge supply is not discharged towards ground, while at the same time allowing a recharging of the charge supply, based on the gate charge from the gate capacitor of the first power switch.

The circuit may comprise a control unit which is configured to close the first on-control switch to couple the charge supply to the gate of the first power switch, while the first off-control switch is open. Alternatively or in addition, the control unit may be configured to close the first off-control switch to couple the gate of the first power switch to ground via the primary winding of the transformer, while the first on-control switch is open. As such, the control unit may be configured to control the first off/on-control switches such that the first power switch is commutated between the on-state and the off-state. It should be noted that the control unit may be configured to operate the first on- and/or off-control switches in a pulsed mode, by closing the first on- and/or off-control switches during a pulse duration, wherein the pulse duration is shorter than duration of the on-state and the off-state of the first power switch, respectively. The pulse duration should be sufficient to charge and to discharge the gate capacitor of the first power switch, respectively, thereby ensuring an opening and a closing of the first power switch, respectively.

As indicated above, the charge supply may comprise a gate capacitor of a gate of a second power switch. The second power switch may comprise a transistor, e.g. a metal oxide semiconductor field effect transistor. The first power switch may be a low side switch and the second power switch may be a high side switch of a half bridge. As such, the first and second power switches may be arranged in series, with the second power switch being coupled to a high side voltage and the first power switch being coupled to a low side voltage (e.g. ground). The circuit (e.g. the control unit of the circuit) may be configured to control the second power switch via the gate of the second power switch. In particular, the circuit (e.g. the control unit) may be configured to put the second power switch in on-state, when the first power switch is in off-state, and to put the first power switch in on-state, when the second power switch is in off-state. In other words, the first and second power switches may be put in respective on/off-states in an alternating manner.

The circuit (e.g. the control unit) may be configured to provide a gate charge to the gate capacitor of the second power switch using (or based on) the gate charge of the first power switch, thereby putting the second power switch to on-state. Furthermore, the circuit (e.g. the control unit) may be configured to provide the gate charge to the gate capacitor of the first power switch using (or based on) the gate charge of the second power switch, thereby putting the first power switch to on-state. As such, the circuit may be configured to bounce the gate charge between the first and second power switches, thereby allowing for a commutation of the first and second power switches in an energy efficient manner.

The secondary winding of the transformer may be coupled at one end to the gate of the second power switch and the other end of the secondary winding may be coupled to a midpoint of the half bridge between the second power switch and the first power switch. In particular, the secondary winding of the transformer may be coupled to the gate of the second power switch via a second control switch. As outlined above, the transformer may alternatively or in addition be configured to charge the energy back to a voltage or energy supply. This may be the case e.g. for a boost converter which uses only a single power switch. The circuit (e.g. the control unit) may be configured to close the second control switch for putting the second power switch to on-state, and to open the second control switch for putting the second power switch to off-state. In a similar manner to the first control switches, the second control switch may be operated in a pulsed mode. The second control switch may comprise a diode configured to let pass a current from the secondary winding towards the gate of the second power switch, and configured to block a current from the gate of the second power switch towards the secondary winding. The use of a diode allows for a fast switching of the second control switch. Furthermore, the second control switch may comprise a transistor configured to short circuit the diode when closed, thereby allowing for a discharging of the gate capacitor of the second power switch.

The circuit may further comprise a start-up control switch configured to couple the gate of the first power switch to a supply voltage. The circuit (e.g. the control unit of the circuit) may be configured to control the start-up control switch (e.g. to close the start-up control switch) to provide the gate charge to the gate capacitor of the first power switch from the supply voltage, during a start-up phase of the circuit. As such, the first power switch may be provided with an initial gate charge from the supply voltage, wherein the initial gate charge may be recovered and reused when commutating the first power switch. Furthermore, the start-up control switch may be used to compensate for possible losses incurred when recovering and reusing the gate charge.

According to another aspect, a power converter, e.g. a switched-mode power converter, comprising the above mentioned control circuit and the above mentioned first and/or second power switch is described.

According to a further aspect, a method for controlling a first power switch via a gate of the first power switch is disclosed. The gate of the first power switch comprises a gate capacitor. The method may comprise coupling the gate of the first power switch with a charge supply to provide a gate charge to the gate capacitor of the first power switch, thereby putting the first power switch to the on-state. Furthermore, the method may comprise coupling the gate of the first power switch with ground via a primary winding of a transformer to discharge the gate capacitor of the first power switch, thereby causing a discharge current through the primary winding and thereby putting the first power switch to the off-state. A secondary winding of the transformer may be coupled to the charge supply, such that a current, which is induced in the secondary winding by the discharge current in the primary winding, recharges the charge supply.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

SHORT DESCRIPTION OF THE FIGURES

The invention is explained below in an exemplary manner with reference to the accompanying drawings, wherein FIG. 1a illustrates an example circuit arrangement configured to recover the gate charge of a power switch;

FIG. 3b shows an example circuit arrangement configured to bounce the gate charge between the plurality of power switches of the half bridge of FIG. 3a.

DETAILED DESCRIPTION

Figure 1A:
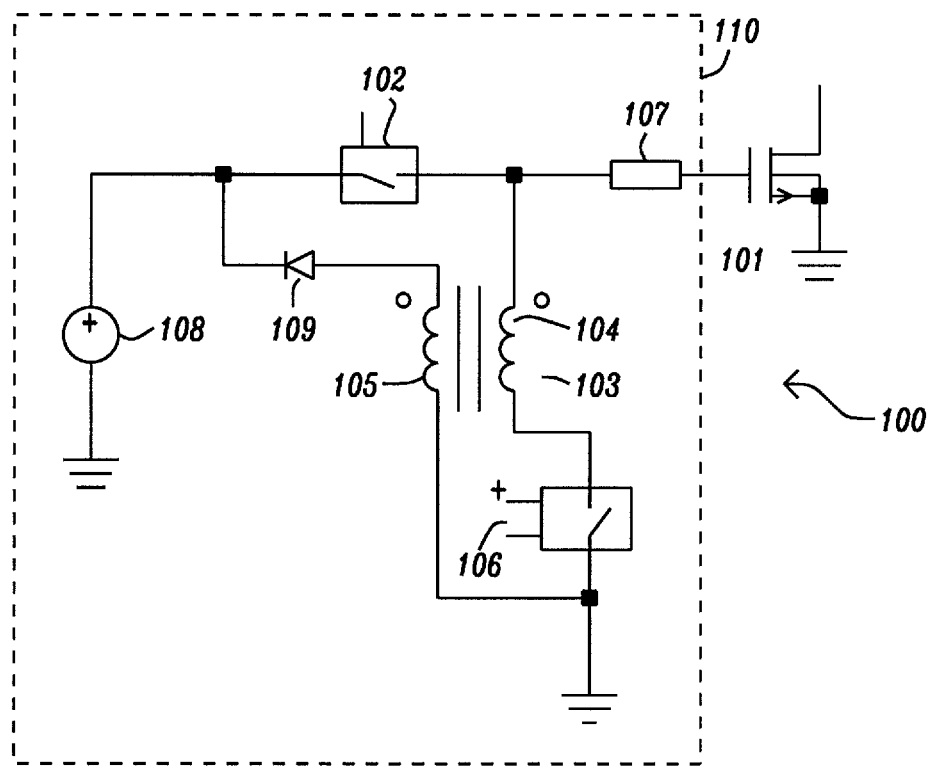
FIG. 1b illustrates an example concept for recovering the gate charge of a power switch.

FIG. 1a shows an example circuit arrangement 100 comprising a power switch 101 and a circuit 110 for controlling the power switch 101. The power switch 101 may be a MOSFET, e.g. a P-channel or an N-channel FET. In FIG. 1a an NMOS transistor is shown as the power switch 101. Using the on-switch 102 (which is a control switch for controlling the state of the power switch 101), the voltage 108 is applied to the gate of the power switch 101, thereby charging a gate capacitance of the power switch 101 and thereby putting the power switch 101 in the on-state. On the other hand, using the off-switch 106 (which is a control switch for controlling the state of the power switch 101), the gate of the power switch 101 is coupled to ground, thereby discharging the gate capacitance and thereby putting the power switch 101 in the off-state. Typically, the on-switch 102 and the off-switch 106 are operated such that when the on-switch 102 is closed, the off-switch 106 is open, and vice versa. FIG. 1a also comprises an optional resistor 107. The resistor 107 may be used to reduce current spices.

In the present document, it is proposed to use a transformer 103 to recover the gate charge of the power switch 101, when the power switch 101 is switched from the on-state to the off-state. The transformer 103 comprises a primary winding 103 and a secondary winding 105. The primary winding 103 and the secondary winding 105 may have an opposed polarity. The polarity of the primary winding 103 and the secondary winding 105 may be selected in accordance to the desired polarity of the voltages at the windings (e.g. in case of negative voltages). The transformer 103 may be used to couple the current which is due to the gate charge (when the off-switch 106 is closed) from the primary winding 104 to the secondary winding 105. The induced current in the secondary winding 105 may be used to re-charge the voltage source 108, thereby recovering the gate charge.

The circuit arrangement may comprise a diode 109 configured to let pass the induced current in the secondary winding 105 and configured to block a current flowing in the opposed direction. As such, the diode 109 is configured to decouple the voltage source 108 and the transformer 103. In particular, the diode 109 is configured to decouple the voltage source 108 from ground (as the secondary winding 105 of the transformer 103 is coupled to ground).

The circuit arrangement 100 is configured to recover the gate charge of the power switch 101, thereby allowing the power switch 101 to be commutated between the on-state and the off-state in a power efficient manner. By closing the on-switch 102, the gate capacitance of the power switch 101 is charged, and by closing the off-switch 106, the gate capacitance of the power switch 101 is discharged. The gate charge of the gate capacitance is coupled back to the voltage supply 108 using the transformer 103, thereby recovering the gate charge, and thereby enabling a quasi lossless commutation of the power switch 101.

The power switch 101 may be operated in a pulsed mode. This means that the on-switch 102 and the off-switch 106 may be closed briefly, in order to charge and discharge, respectively, the gate capacitance (or the gate capacitor) of the power switch 101 and to thereby put the power switch 101 into the on-state 102 and the off state 106, respectively. The duration of the closed periods of the on-switch 102 and the off-switch 106 (i.e. the duration of the control pulses) is typically shorter than the duration of the on-state and the off-state of the power switch 101. In particular, the duration of the control pulses may be selected such that the pulses ensure a charging and/or a discharging of the gate capacitance of the power switch 101.

Figure 1B:
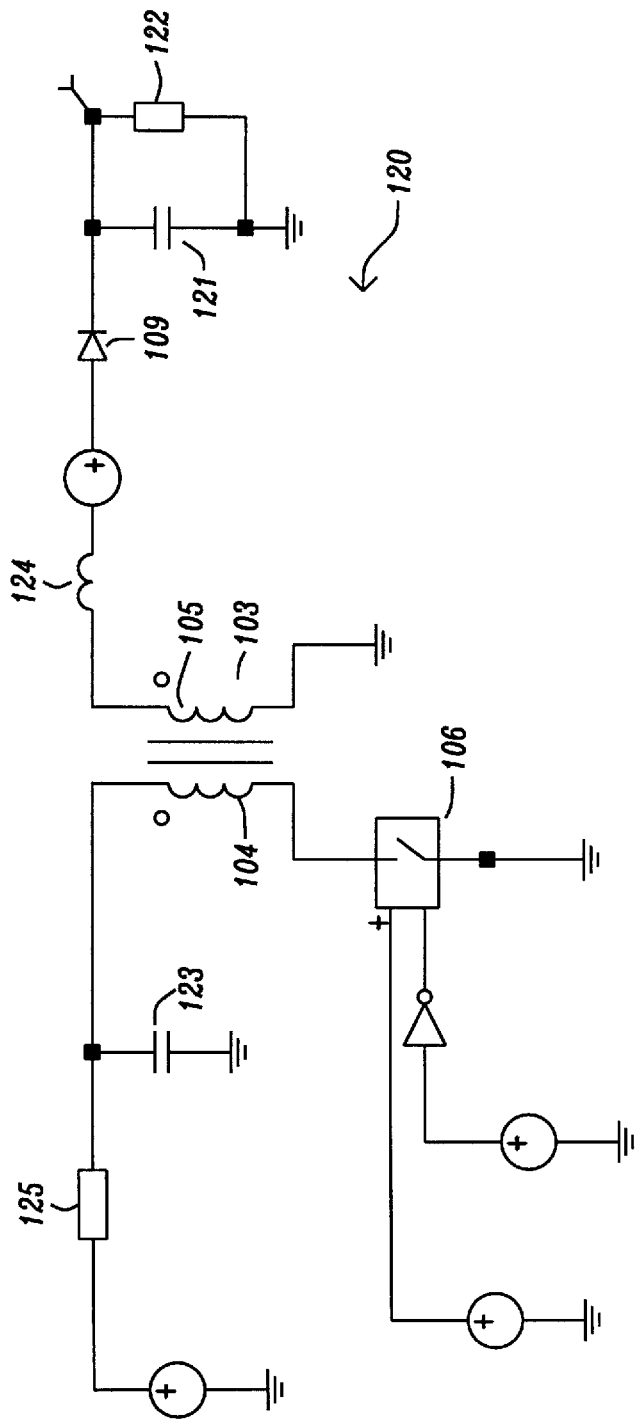

FIG. 1b shows a block diagram 120 which illustrates an example concept for recovering the gate charge. In the block diagram 120, the power switch 101 is represented by its gate capacitance (or gate capacitor) 123 and by the resistance 125. It is assumed that the power switch 101 is in on-state, i.e. it is assumed that the gate capacitance 123 is charged with the gate charge. When closing the off-switch 106, the gate capacitor 123 is coupled to ground via the transformer 103, thereby causing a discharge current through the primary winding 104 of the transformer 103. The discharge current through the primary winding 104 corresponds to the gate charge, and it is electromagnetically coupled to the secondary winding 105 of the transformer 103. The current through the secondary winding 105 may be used to charge a storage capacitance 121 (via the diode 109). As such, the gate charge may be transferred from the gate capacitor 123 to the storage capacitor 121. The energy stored in the storage capacitor 121 may be reused, e.g. to re-charge the gate capacitor 123 of the power switch 101, when switching the power switch 101 from the off-state to the on-state.

The block diagram 120 also comprises a coil 124 which may be used for attenuation purposes. Furthermore, the block diagram 120 comprises a resistor 122. The resistor 122 is used for simulation purposes and forms an RC circuit in conjunction with the storage capacitor 121.

In other words, the capacitor 123 of FIG. 1a represents the gate capacitance of the power switch 101. Typical values for the gate capacitance are in the range of 2 nF. The off-switch 106 may be used to discharge the gate of the power switch 101, i.e. to discharge the gate capacitor 123. The transformer 103 may be used to transfer the stored energy of the gate capacitor 123 to the secondary side of the transformer 103. The additional coil 124 may be used to make a voltage to current conversion and to transfer the energy to the storage capacitor 121 (energy storage), thereby recovering the gate charge. The additional coil 124 in series to the transformer 103 may be used for current spice reduction and may help to increase the efficiency of energy recovery. The coil 124 may be used depending on the design of the transformer 103.

As indicated above, the power switch 101 may be operated in a pulsed mode. Using the on-switch 102, the gate of the power switch 101 may be charged using only a short pulse (i.e. by closing the on-switch 102 during a time interval which is shorter than the time interval of the on-state of the power switch 101). After the charge is stored in the gate capacitor 123 of the power switch 101, the on-switch 102 may be opened again. The discharge of the gate capacitor 123 may be done using the off-switch 106 (by closing the off-switch 106 for a duration which is shorter than the duration of the off-state of the power switch 101). The energy stored in the gate capacitor 123 may be recharged to the voltage supply 108 by means of the transformer 103 and the diode 109. It should be noted that the diode 109 may be an active rectifier or an active switch (e.g. a transistor).

With the approach described in the context of FIGS. 1a and 1b, the size of the gate of a power switch 101 becomes less critical for the efficiency of the power switch 101. As such, power switches 101 having a reduced on-resistance at the expense of an increased gate capacitance may be designed. The increased gate capacitance does not lead to increased losses, as the gate charge can be recovered using the circuit arrangement shown in FIGS. 1a and 1b. As such, the on-resistance of a power switch 101 can be lowered without causing additional switching losses (due to the increased gate capacitance). The approach described in the present document is applicable to N and P channel power switches 101.

Figure 2:
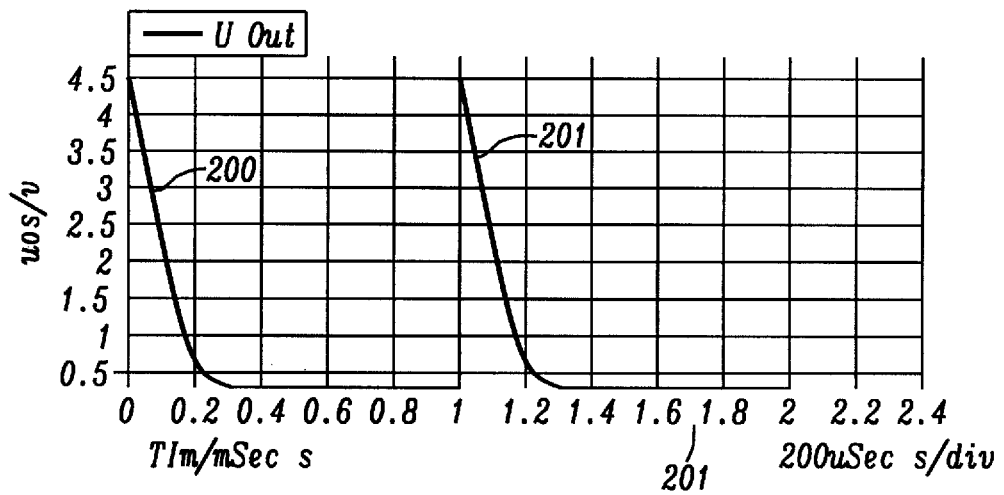
FIG. 2 shows the voltage drop across the example storage capacitor of FIG. 1b.

FIG. 2 shows the voltage drop 200 at the storage capacitor 121 along the time line 201. It can be seen that the storage capacitor 121 is charged periodically with the gate charge from the gate capacitor 123. Subsequently, the charge in the storage capacitor 121 is discharged via the resistor 122 (shown by the decay of the voltage 200). Alternatively, the charge in the storage capacitor 121 could be reused, e.g. to recharge the gate capacitor 123 when putting the power switch 101 into the on-state.

Figure 3A:
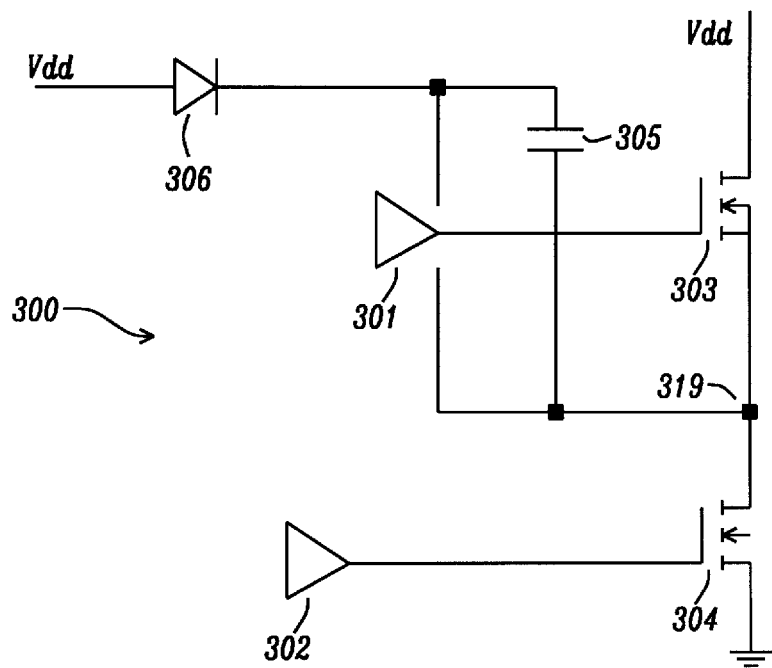
FIG. 3a shows the block diagram of an example half bridge comprising a plurality of power switches.

The method for recovering the gate charge of a power switch may be applied to a plurality of power switches, e.g. to the high side and the low side switch of a half bridge. Such a half bridge may be used e.g. in a buck converter. FIG. 3a shows the circuit diagram of an example half bridge 300 comprising the high side switch 303 and the low side switch 304. The high side switch 303 and the low side switch 304 are arranged in series, wherein the point where the high side switch 303 is coupled to the low side switch may be referred to as the midpoint 319 of the half bridge 300. The high side switch 303 may be coupled to a high side voltage (e.g. the supply voltage Vdd) and the low side switch 304 may be coupled to ground. The high side switch 303 may be controlled using the control unit 301 and the low side switch 304 may be controlled using the control unit 302. The control unit 301, 302 may be powered using a supply voltage Vdd provided by a supply voltage capacitor 305 which is recharged via a diode 306. The half bridge 300 is typically operated such that the high side switch 303 and the low side switch 304 are operated in a commutated manner, such that when the high side switch 303 is in on-state, the low side switch 304 is in off-state, and vice versa.

Figure 3B:
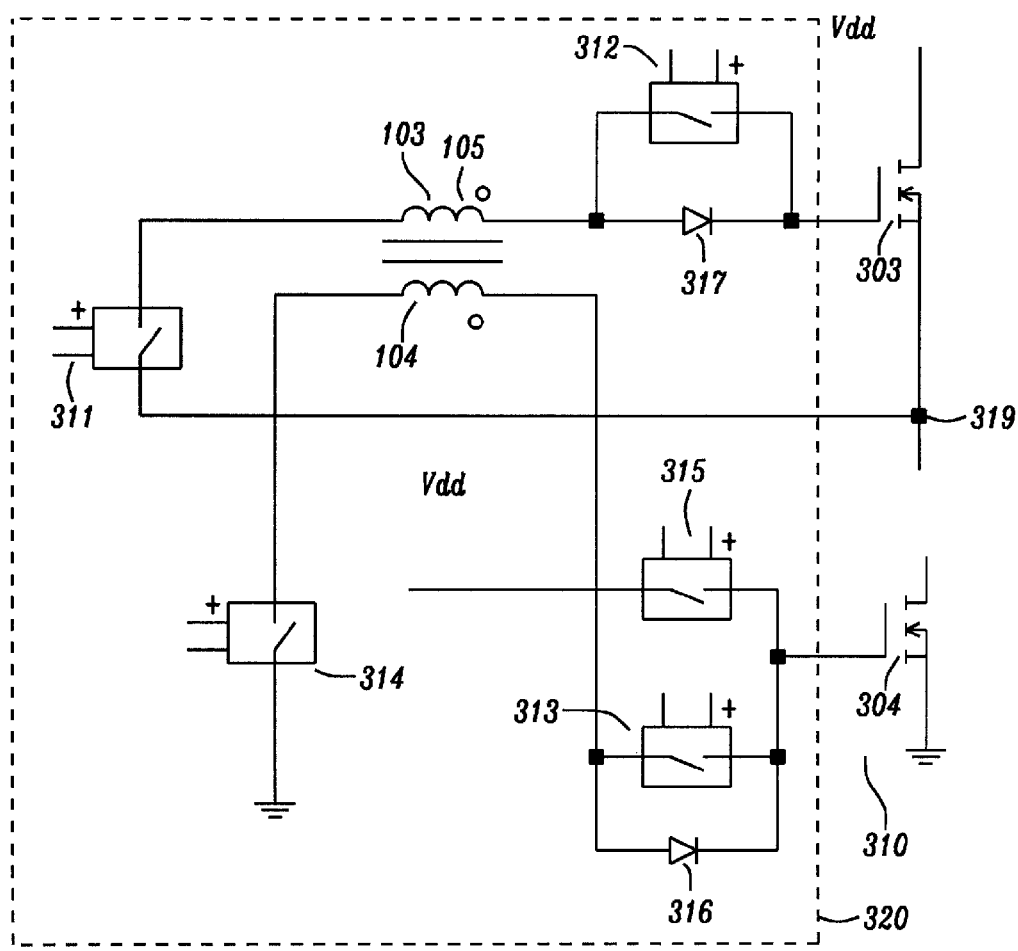

FIG. 3b shows the circuit diagram of an example half bridge 310, for which the gate charge of the high side switch 303 is used to charge the gate capacitor of the low side switch 304, when the high side switch 303 is commutated from on-state to off-state, and when the low side switch 304 is commutated from off-state to on-state. In a similar manner, the gate charge of the low side switch 304 is used to charge the gate capacitor of the high side switch 303, when the low side switch 304 is commutated from on-state to off-state, and when the high side switch 303 is commutated from off-state to on-state. FIG. 3b also shows a circuit 320 for controlling the half bridge 310.

During start-up of the half bridge 310, the supply voltage Vdd may be applied to the low side switch 304 by closing the low side on-switch 315 (which is a control switch for controlling the state of the low side switch 304), thereby charging the gate capacitor of the low side switch 304 and thereby putting the low side switch 304 into the on-state. At the same time, the first and second low side off-switches 313, 314 (which are control switches for controlling the state of the low side switch 304) may be kept open. As indicated above, the high side switch 303 is typically in off-state, when the low side switch 304 is in on-state. This may be achieved by closing the high side on-switch 311 and the high side off-switch 312.

The low side switch 304 may be commutated to the off-state by opening the low side on-switch 315 and by opening the first and second low side off-switches 313, 314. As a result, the gate of the low side switch 304 is coupled to ground, thereby discharging the gate capacitor of the low side switch 304 and thereby putting the low side switch 304 into off-state. The current caused by the discharging of the gate capacitor of the low side switch 304 traverses the primary coil 104 of the transformer 103, thereby inducing a current in the secondary coil 105. The induced current may be used to charge the gate capacitor of the high side switch 303 via the diode 317 (notably when the high side off-switch 311 is closed); thereby putting the high side switch 303 into on-state. As such, the gate charge from the low side switch 304 may be used to charge the gate of the high side switch 303, thereby providing an energy efficient scheme for operating the half bridge 310.

By closing the high side off-switch 312 (which is a control switch for controlling the state of the high side switch 303), the diode 317 may be short circuited. As such, the gate of the high side switch 303 may be discharged via the high side off-switch 312, thereby putting the high side switch 303 into the off-state. The discharging of the gate capacitor of the high side switch 303 generates a current through the secondary coil 105 of the transformer 103, thereby inducing a current in the primary coil 104. The induced current in the primary coil 104 may be used to charge the gate capacitor of the low side switch 304 via the diode 316, thereby putting the low side switch 304 in the off-state.

The low side on-switch 315 may be used to supply an additional charge via the supply voltage Vdd, in order to compensate for losses which may be incurred during the bouncing of the gate charge between the low side switch 304 and the high side switch 303. As such, the low side on-switch 315 may be used for start-up of the half bridge 310 (i.e. for providing an initial gate charge) and/or for compensating losses of the gate charge during operation of the half bridge 310.

Table 1 shows the switching states of the control switches 311, 312, 313, 314, 315 for operating the half bridge 310. As indicated above, the low side on-switch 315 may be used to compensate for losses that may have been incurred during the bouncing of the gate charge. In the absence of losses, the low side on-switch 315 may be kept open, subsequent to the start-up of the half bridge 310. As such, the low side on-switch 315 may be used for start-up purposes (i.e. for providing the initial gate charge) and for loss compensation purposes.

TABLE 1

| Status Half Bridge | Switch 315 | Switch 313 | Switch 314 | Switch 312 | Switch 311 |
| --- | --- | --- | --- | --- | --- |
| Low side switch: on-state High side switch: off-state | Possibly closed | Open | Open | Closed | Closed |
| Low side switch: off-state High side switch: on-state | Open | Closed | Closed | Open | Closed |

As can be seen from Table 1, the half bridge 310 is triggered to put the low side switch 304 into the on-state (starting from the off-state) and to put the high side switch 303 into the off-state (starting from the on-state), by closing the high side off-switch 312 (while opening or maintaining open the first and second low side off-switches 313, 314). In a similar manner, the half bridge 310 is triggered to put the low side switch 304 into the off-state (starting from the on-state) and to put the high side switch 303 into the on-state (starting from the off-state), by closing the first and second low side off-switch 313, 314 (while opening or maintaining open the high side off-switch 312). Furthermore, it can be seen from Table 1 that the switch 311 is optional (as it remains closed)

As already outlined in the context of FIGS. 1a and 1b, the power switches 303 and 304 (i.e. the high side and low side switch of the half bridge 310) may be operated in a pulsed mode or in a continuous mode. The length of the pulse may be sufficiently long to allow for a complete charging/discharging of the respective gate capacitors.

As such, the concept of recovering the gate charge of a power switch may be used for a half bridge output stage (comprising e.g. two N-channel transistors). The gate energy may toggle between the low side switch 304 and the high side switch 303, thereby allowing for an energy efficient operation of the half bridge 310. A non-overlapping operation of the low side switch 304 and the high side switch 303 may be ensured by inserting a relatively small resistor between the transformer 103 and the gate of the high side switch 303 and/or the gate of the low side switch 304, thereby adding a delay. As already indicated above, possible losses may be compensated by supping a small current to the gates during the on-state, as illustrated for the low side switch 304 (using the low side on-switch 315).

Figure 4:
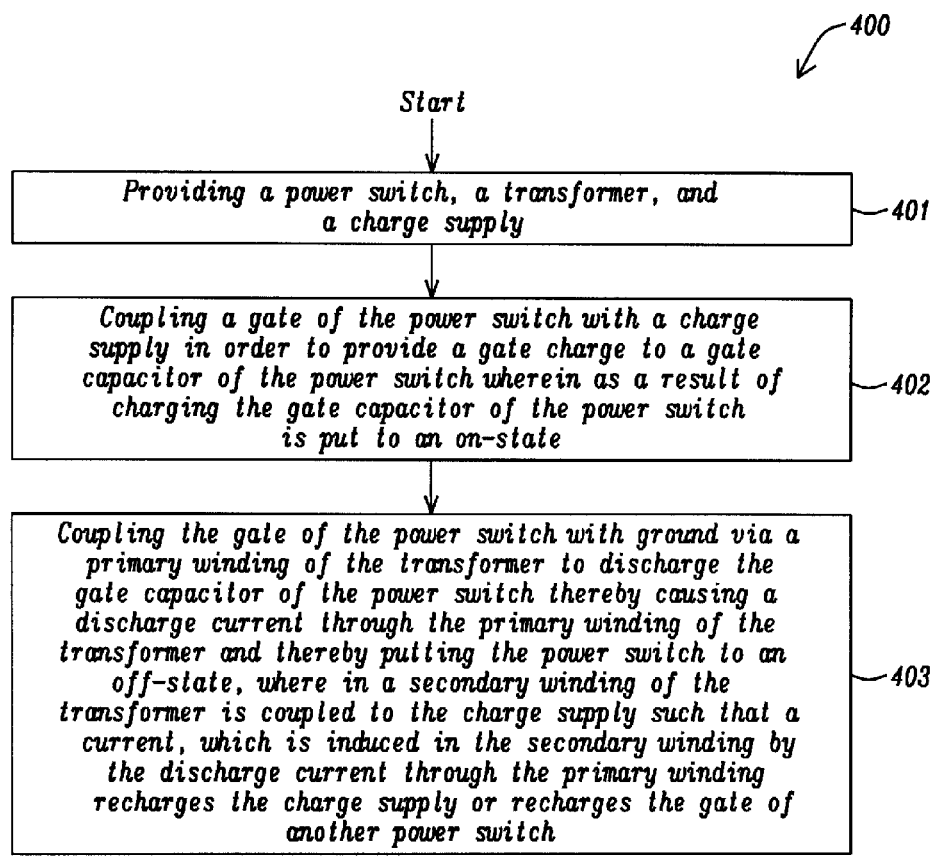
FIG. 4 shows the flow chart of an example method for recovering the gate charge of a power switch.

FIG. 4 shows a flow chart of an example method 400 for controlling a power switch 101 in a power efficient manner. The power switch 101 may be controlled via a gate of the power switch 101. As outlined above, the gate of the power switch 101 typically comprises a gate capacitor. The first step 401 of the method teaches the provision of a power switch, a transformer, and a charge supply. The method 400 further comprises the step 402 of coupling the gate of the power switch 101 with a charge supply, e.g. with the voltage supply 108 of with the gate of another power switch, in order to provide a gate charge to the gate capacitor of the power switch 101. As a result of charging the gate capacitor of the power switch 101, the power switch 101 is put to the on-state. The method further comprises the step 403 of coupling the gate of the power switch 101 with ground via the primary winding 104 of the transformer 103 to discharge the gate capacitor of the power switch 101, thereby causing a discharge current through the primary winding 104 and thereby putting the power switch 101 to the off-state. The secondary winding 105 of the transformer 103 may be coupled to the charge supply 108, such that a current, which is induced in the secondary winding 105 by the discharge current through the primary winding 104, recharges the charge supply, e.g. recharges the voltage supply 108 or recharges the gate of another power switch.

In the present document, a circuit arrangement and a method for operating a power switch (or a plurality of power switches) in a power efficient manner has been described. In particular, it is proposed to make use of a transformer to recover the gate charge of the one or more power switches, when putting the one or more power switches into the off-state. The recovered gate charge may be used e.g. to recharge the gate of the one or more power switches, when putting the one or more power switches into the on-state. As a result, the losses incurred by the commutation of the power switches may be reduced.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. A circuit configured to control a first power switch via a gate of the first power switch; wherein the gate of the first power switch comprises a gate capacitor; the circuit comprising
    a first on-control switch configured to couple the gate of the first power switch with a charge supply to provide a gate charge to the gate capacitor of the first power switch, thereby putting the first power switch to the on-state;
    a transformer comprising a primary winding and a secondary winding which are electromagnetically coupled; and
    a first off-control switch configured to couple the gate of the first power switch with ground via the primary winding of the transformer to discharge the gate capacitor of the first power switch, thereby causing a discharge current through the primary winding and thereby putting the first power switch to the off-state; wherein the secondary winding is coupled to the charge supply, such that a current, which is induced in the secondary winding by the discharge current in the primary winding, recharges the charge supply.

2. The circuit of claim 1, wherein
the secondary winding is coupled at one end to ground and at another end to the charge supply; and
the circuit further comprises a decoupling switch which is configured to decouple the charge supply from ground to prevent a discharging of the charge supply to ground.

3. The circuit of claim 2, wherein the decoupling switch comprises a diode function which is configured to block a current from the charge supply to ground.

4. The circuit of claim 1, wherein the circuit comprises a control unit which is configured to
    close the first on-control switch to couple the charge supply to the gate of the first power switch, while the first off-control switch is open; and/or
    close the first off-control switch to couple the gate of the first power switch to ground via the primary winding of the transformer, while the first on-control switch is open.

5. The circuit of claim 4, wherein
the control unit is configured to operate the first on- and off-control switches in a pulsed mode, by closing the first on- and off-control switches during a pulse duration; and
the pulse duration is shorter than a duration of the on-state and the off-state of the first power switch, respectively.

6. The circuit of claim 1, wherein
the transformer comprises a plurality of secondary windings which is electromagnetically coupled to the primary winding; and
the plurality of secondary windings is coupled to a respective plurality of charge supplies, such that currents which are induced in the plurality of secondary windings by the discharge current in the primary winding, charge the plurality of charge supplies, respectively.

7. The circuit of claim 1, wherein the charge supply comprises a gate capacitor of a gate of a second power switch.

8. The circuit of claim 7, wherein
the first power switch is a low side switch and the second power switch is a high side switch of a half bridge;
the circuit is configured to control the second power switch via the gate of the second power switch; and
the circuit is configured to put the second power switch in on-state, when the first power switch is in off-state, and to put the first power switch in on-state, when the second power switch is in off-state.

9. The circuit of claim 8, wherein the secondary winding of the transformer is coupled at one end to the gate of the second power switch and at the other end to a midpoint of the half bridge between the second power switch and the first power switch.

10. The circuit of claim 8, wherein the circuit is configured to
    provide a gate charge to the gate capacitor of the second power switch using the gate charge of the first power switch, thereby putting the second power switch to on-state; and
    provide the gate charge to the gate capacitor of the first power switch using the gate charge of the second power switch, thereby putting the first power switch to on-state.

11. The circuit of claim 8, wherein
the secondary winding of the transformer is coupled to the gate of the second power switch via a second control switch; and
the circuit is configured to close the second control switch for putting the second power switch to on-state, and to open the second control switch for putting the second power switch to off-state.

12. The circuit of claim 11, wherein the second control switch comprises
    a diode configured to let pass a current from the secondary winding towards the gate of the second power switch, and configured to block a current from the gate of the second power switch towards the secondary winding; and
    a transistor configured to short circuit the diode when closed.

13. The circuit of claim 1, wherein the first on-control switch comprises a diode configured to let pass a current from the primary winding of the transformer towards the gate of the first power switch, and to block a current from the gate of the first power switch towards the primary winding.

14. The circuit of claim 1, further comprising a start-up control switch configured to couple the gate of the first power switch to a supply voltage; wherein the circuit is configured to control the start-up control switch to provide the gate charge to the gate capacitor of the first power switch from the supply voltage, during a start-up phase of the circuit.

15. A method for controlling a first power switch via a gate of the first power switch; wherein the gate of the first power switch comprises a gate capacitor; the method comprising the steps of:
    providing a circuit comprising the first power switch, a transformer, and a charge supply;
    coupling the gate of the first power switch with a charge supply to provide a gate charge to the gate capacitor of the first power switch, thereby putting the first power switch to the on-state; and
    coupling the gate of the first power switch with ground via a primary winding of a transformer to discharge the gate capacitor of the first power switch, thereby causing a discharge current through the primary winding and thereby putting the first power switch to the off-state.

16. The method of claim 15, wherein a secondary winding of the transformer is coupled to the charge supply, such that a current, which is induced in the secondary winding by the discharge current in the primary winding, recharges the charge supply.

17. The method of claim 16, wherein the charge supply comprises a gate capacitor of another power switch wherein the gate charge of the first power switch and the other power switch is bounced between different gate capacitors.

18. The method of claim 15, wherein the transformer comprises a plurality of secondary windings which are electromagnetically coupled to the primary winding, wherein the plurality of secondary windings is used to distribute a recovered gate charge from the first power switch to a plurality of different charge supplies, wherein the plurality of secondary windings is coupled to a respective plurality of charge supplies, such that currents, which are induced in the plurality of secondary windings by the discharge current in the primary winding, charge the plurality of charge supplies, respectively.

19. The method of claim 15, wherein the circuit comprises a plurality of first power switches in parallel, and that the circuit may be configured to recover the gate charge of the plurality of parallel first power switches.

20. The method of claim 15, wherein the charge supply comprises a gate capacitor of a gate of a second power switch, wherein the first power switch is a low side switch and the second power switch is a high side switch of a half bridge, wherein the first and second power switches are arranged in series, with the second power switch being coupled to a high side voltage and the first power switch being coupled to a low side voltage, wherein the circuit is configured to control the second power switch via the gate of the second power switch, and wherein the circuit is configured to put the second power switch in on-state, when the first power switch is in off-state, and to put the first power switch in on-state, when the second power switch is in off-state in an alternating manner.

21. The method of claim 20, wherein the circuit is configured to bounce the gate charge between the first and second power switches.

22. The method of claim 15, wherein a software program is adapted to execute the method steps on a processor.

23. The method of claim 22, wherein a storage medium comprises the software program adapted for execution on the processor.

* * * * *